United States Patent [19]

Chang et al.

[11] 4,446,438

[45] May 1, 1984

[54] SWITCHED CAPACITOR N-PATH FILTER

[75] Inventors: Chieh Chang, Belmont; Man S. Lee, San Mateo, both of Calif.

[73] Assignee: GTE Automatic Electric Incorporated, Northlake, Ill.

[21] Appl. No.: 314,827

[22] Filed: Oct. 26, 1981

[51] Int. Cl.³ .......................... G06G 7/18; H03K 5/00; H03B 1/00
[52] U.S. Cl. ..................................... 328/127; 307/491; 307/494; 328/167; 328/147; 333/173; 330/9
[58] Field of Search ................. 328/127, 167; 307/352, 307/353, 520; 330/107, 9; 333/173

[56] References Cited

U.S. PATENT DOCUMENTS

| | | | |
|---|---|---|---|
| 3,795,877 | 3/1974 | Poole | 328/167 |
| 4,179,665 | 12/1979 | Gregorian | 328/167 |
| 4,315,227 | 2/1982 | Fleischer et al. | 333/173 |
| 4,331,894 | 5/1982 | Gregorian et al. | 307/520 |
| 4,333,064 | 6/1982 | Kato et al. | 333/173 |
| 4,365,204 | 12/1982 | Haque | 328/127 |
| 4,375,625 | 3/1983 | Lee | 328/167 |

OTHER PUBLICATIONS

Bosshart, "A Multiplexed Switched Capacitor Filter Bank", IEEE Journal of Solid—State Circuits, vol. SC-15, No. 6, Dec. 80, pp. 939-945.
Allstot et al., "A Switched Capacitor N—path Filter", IEEE International Symposium on Circuits & Systems, May 80, pp. 313-316.

*Primary Examiner*—John S. Heyman
*Assistant Examiner*—Timothy P. Callahan
*Attorney, Agent, or Firm*—Russell A. Cannon

[57] ABSTRACT

A switched capacitor N-path filter in which all capacitors that introduce delay in the paths, in that they have memory and are characterized such that the new charge flow into each such capacitor during each commutation cycle depends on the old charge on it from the previous commutation cycle, are replaced with an associated plurality of N-commutating capacitors.

5 Claims, 4 Drawing Figures

SWITCHED CAPACITOR N-PATH FILTER

BACKGROUND OF INVENTION

This invention relates to switched capacitor N-path filters and to an improved method of synthesizing switched capacitor N-path filters.

A monolithic N-path filter implemented with MOS sampled data techniques is described in the article, "A Switched Capacitor N-Path Filter" by D. J. Allstot and K. S. Tan, IEEE International Symposium on Circuits and Systems, May 1980, pp. 313–316, which is incorporated herein by reference. The idea there is to develop a switched capacitor active-ladder equivalent of a prototype ladder filter with the energy storage or integrating capacitor of each integrator being replaced by N identical commutating capacitors and MOSFET switches which share a common active element. Although this technique gives additional freedom in designing filters with transfer functions having complex poles and zeros and provides fully integrated N-path filters, it has been found that the characteristics of the resultant network only approximates those of the corresponding prototype ladder filter, i.e., the ripple and loss in the prototype and resultant filters may not be the same magnitudes nor that predicted by N-path filter theory.

An object of this invention is the provision of an improved switched capacitor N-path filter.

SUMMARY OF INVENTION

In accordance with this invention, a commutating switched capacitor integrator circuit in a N-path filter comprises: an active element having a first input terminal and an output terminal; a first plurality of N capacitors, each having the same value of capacitance; first switch means selectively-sequentially connecting, at a commutating rate, individual ones of the first plurality of capacitors as integrating capacitors between the active elements' first input and output terminals only during associated pairs of adjacent time slots for storing charge; and connecting means for selectively-sequentially connecting one of: (1) one and other sides of individual ones of a second plurality of N capacitors, each having the same value of capacitance at the commutating rate $f_c$, between the first input terminal and a second input terminal, respectively, only during associated pairs of adjacent time slots for selectively storing charge for an input voltage on the second input terminal; and (2) one and other sides of individual ones of a third plurality of capacitors, each having the same value of capacitance, during associated pairs of adjacent time slots in a manner so as to alternately connect, at the commutating rate and during first and second time slots of each pair thereof, one and other sides of an individual one of the third plurality of capacitors to the first input terminal and a ground reference potential, respectively, and to ground and a third input terminal, respectively, for alternately transferring charge between associated ones of the third and first plurality of capacitors and storing charge on the associated one of the third plurality of capacitors for an input voltage on the third input terminal, respectively. In accordance with another aspect of this invention, a method of transforming a prototype switched capacitor integrator-filter network into a switched capacitor N-path filter comprises the steps of replacing the integrating capacitor with a plurality of N identical commutation capacitors, identifying other capacitors in the prototype that introduce delay in paths, and replacing all such identified capacitors with an associated plurality of N-commutating capacitors.

DESCRIPTION OF PREFERRED EMBODIMENTS

Embodiments of this invention are described in the paper, "Exact Synthesis of N-Path Switched Capacitor Filters" by Man Shek Lee and Chieh Chang, presented at the International Symposium on Circuits and Systems, Chicago, Ill., May 1981, and incorporated herein by reference.

Figure 1:
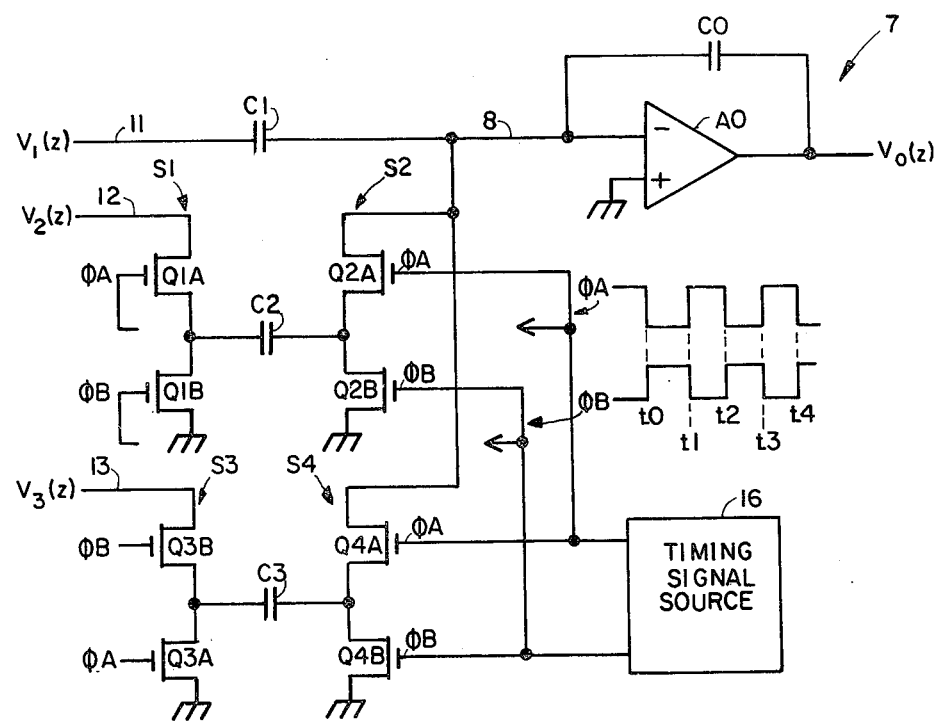
FIG. 1 is a schematic circuit diagram of a switched capacitor integrator circuit 7 which may be an element of a multi-stage switched capacitor filter.

Referring now to FIG. 1, a stray insensitive switched capacitor integrator circuit 7 that is implemented in integrated circuit form comprises a differential input operational amplifier AO that is associated with an integrated feedback capacitor CO, and a plurality of integrated capacitors C1–C3 that are associated with the inverting input of AO. Since the non-inverting input terminal of AO is connected to ground for impressing a virtual ground potential on its inverting input terminal 8 and the amplifier operates as a voltage source, the circuit 7 is insensitive to parasitic capacitance effects associated with both the top and bottom plates of CO. And in a multi-stage filter network comprising a plurality of integrator circuits 7, the lines 11–13 are connected to output terminals of voltage source or ground. Thus, the circuit 7 requires that plates of integrated capacitors C1–C3 be connected to the output of a voltage source, ground or a virtual ground potential; be switched between the output terminal of a voltage source and ground; or be switched between ground and a virtual ground potential. The circuit 7 is therefore also insensitive to parasitic capacitance effects associated with both the top and bottom plates of C1–C3.

The capacitors C1–C3 and any associated switches in FIG. 1 represent the three basic types of capacitor circuits that are employed in parasitic insensitive switched capacitor filters. The switches S1 and S2, that are associated with C2, are each implemented in FIG. 1 with series connected MOSFET transistors. The gate electrodes of these transistors are driven by different ones of a pair of non-overlapping timing signals $\phi A$ and $\phi B$ that are produced by a two-phase timing signal source 16. The common terminals of the transistor pairs are connected to associated plates of C2. The timing signals $\phi A$ and $\phi B$ are 180° out of phase and preferably have a duty cycle of slightly less than 50%. The upper transistors Q1A and Q2A conduct only when $\phi A$ is high for connecting C2 between the source voltage V2(z) and the inverting input of AO, during a first time slot between times t0 and t1. The lower transistors Q1B and Q2B conduct only when φB is high for connecting both sides of C2 to ground for resetting the charge on it to zero during a second time slot between times t1 and t2. All of the transistors of S1 and S2 are non-conducting when φA and φB are both low. The switches S1 and S2 are shown in schematic form in FIG. 2. The transistors of S3 and S4 in FIG. 1 are responsive to φA and φB for alternately connecting C3 between ground and line 8, and between the source voltage V3(z) and ground, so as to alternately transfer charge from C3 to C0 and update charge on C3, respectively.

Considering that the source voltages V1–V3 in FIG. 1 are periodically sampled and stored for presentation on lines 11–13, they are characterized in FIG. 1 by their z-transforms, where z is the operator in the z-domain and V(z) is a discrete time voltage. The charge voltage relationships for operation of capacitors C1–C3 and associated switches on the z-domain are then representable as $$\Delta Q(z) = C1(1-z^{-1})V(z) \quad (1)$$

$$\Delta Q(z) = C2 V(z) \quad (2)$$

$$\Delta Q(z) = -C3(z^{-1})V(z) \quad (3)$$

where ΔQ(z) is the differential charge on the capacitors between adjacent time slots. Reference to equations (1) and (3) reveals that unit delays of $z^{-1}$ are introduced by the storage of information of C1 and C3. More specifically, C1 and C3 have a memory in that the charge on them is updated during each clock cycle in φA and φB (e.g., time T0-t2), whereas the charge on C2 is reset to zero. The capacitor C0 also introduces a unit delay.

Figure 2:
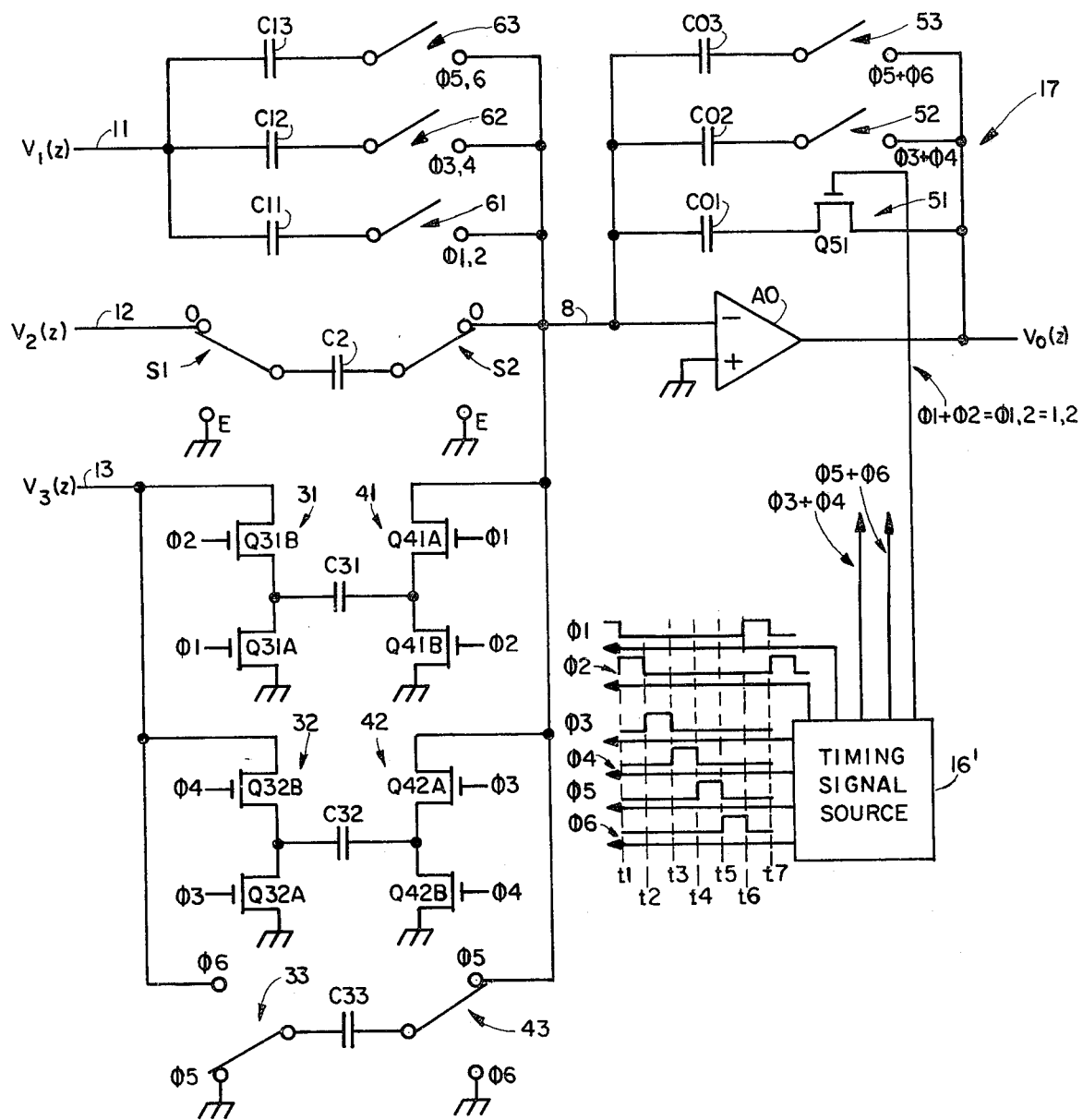
FIG. 2 is a schematic circuit diagram of the corresponding N-path switched capacitor integrator 17 for the integrator circuit in FIG. 1, where N=3.

In accordance with this invention, the integrator 7 is transformed to an associated N-path circuit 17 in FIG. 2 by replacing all of the aforementioned unit delay producing elements with commutation structure introducing N units of delay. That is, C0, C1 and C3 are each replaced with an associated plurality of N commutating capacitors for storing N pieces of information, where N=3 in FIG. 2. The capacitor C0 is replaced here by the capacitors C01, C02 and C03 (all having the same capacitance C0) and associated switches 51, 52 and 53. Similarly, C1 is replaced by capacitors C11, C12 and C13, of the same values, and associated switches 61, 62 and 63. The commutating switches 51–53 and 61–63 are the same types as S1–S4, although some of them are shown in schematic form in FIG. 2 for convenience of illustration. Associated ones of switches 51–53 and 61–63 are driven by timing signals φ1+φ2, φ3+φ4, and φ5+φ6, respectively, in associated pairs of adjacent time slots. These capacitors C01–C03 and C11–C13 store a charge when the associated timing signals are low, with the charge thereon being updated every N-2 time slots. The charge-voltage relationship for these two pluralities of capacitors are therefore of the form $$\Delta Q(z) = C (1-z^{-N})V(z) \quad (4)$$

The switched capacitor C3 is also replaced with N capacitors C31, C32 and C33 of the same values and associated pairs of switches. The transistors of switches 31 and 41 are responsive to timing signals φ1 and φ2 for connecting C31 between ground and A0 in only the first time slot and connecting it between the source voltage V3(z) and ground (for updating charge on C31) in only the second time slot. All of the transistors of switches 31 and 41 are non-conducting when φ1 and φ2 are both low for storing charge on C31 until φ1 subsequently goes high in the seventh time slot here. Switches 32 and 42 connect C32 in a similar manner during the fourth and fifth time slots, i.e., when φ4 and φ5 are high. The switches 33 and 43, which are shown in schematic form in FIG. 2, are responsive to φ5 and φ6 for connecting C33 in a similar manner in the fifth and sixth time slots. Opposite sides of C2 are connected to associated lines 8 and 12 during odd-numbered time slots, and both to ground during even-numbered time slots. The charge-voltage relationship for this plurality of capacitors C3N is therefore of the form $$\Delta Q(z) = -C3(z^{-N})V(z) \quad (5)$$

Considering conservation of charge at the inverting input terminal 8 of A0 in FIG. 2, the charge-voltage relationship there is $$C0(1-z^{-N})V0(z) = C1(1-z^{-N})V1(z) + C2V2(z) -- C3(z^{-N})V3(z) = 0 \quad (6)$$

This operation is repeated in subsequent time slots. In summary, C01, C11 and C31 are operatively connected in circuit 17 during the first and second time slots; C02, C12 and C32 are connected in the integrator during the third and fourth time slots; etc., with both sides of C2 being connected to ground during alternate time slots.

Figure 3:
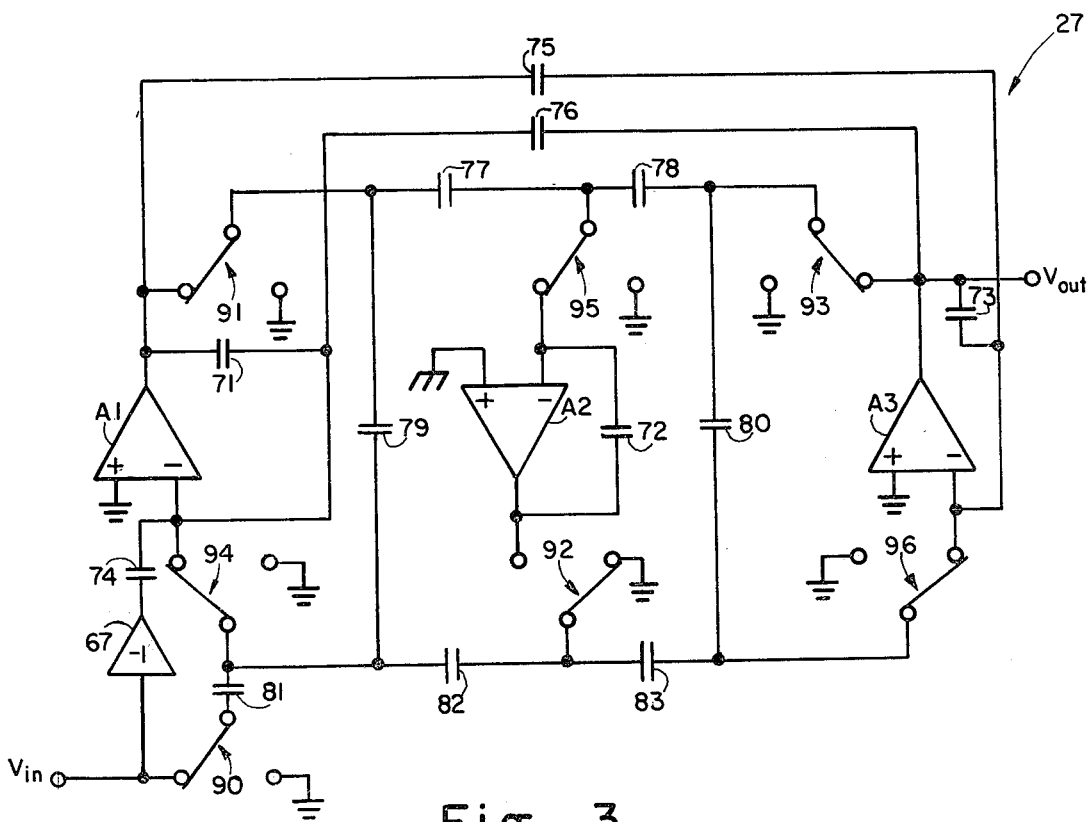
FIG. 3 is a schematic circuit diagram of a multi-stage third order low pass switched capacitor filter including connected capacitors of the three types shown in FIG. 1.

A given low pass prototype switched capacitor filter 27 in FIG. 3 comprises three switched capacitor integrators, each including an associated one of the active elements A1–A3. This filter 27 includes pluralities of the three types of capacitor circuits illustrated in FIG. 1. The capacitors 71–73 are integrating capacitors, whereas the capacitors 74–76 are similar to C1. The capacitors 82 and 83 are essentially switched capacitors, whereas capacitors 77–81 are similar to C2. The filter 27 is designed to meet specifications of: sampling frequency=4 kHz; pass-band edge=100 Hz; pass-band ripple=0.269 db and stop-band rejection=40 db. In this filter 27, the normalized capacitances of integrating and feedback capacitors are: C71=C73=8.122; C72=6.793; and C75=C76=0.541. The capacitors 77–83, inclusive, have normalized unit capacitances, whereas the capacitance of capacitor 74 is half that value.

Figure 4:
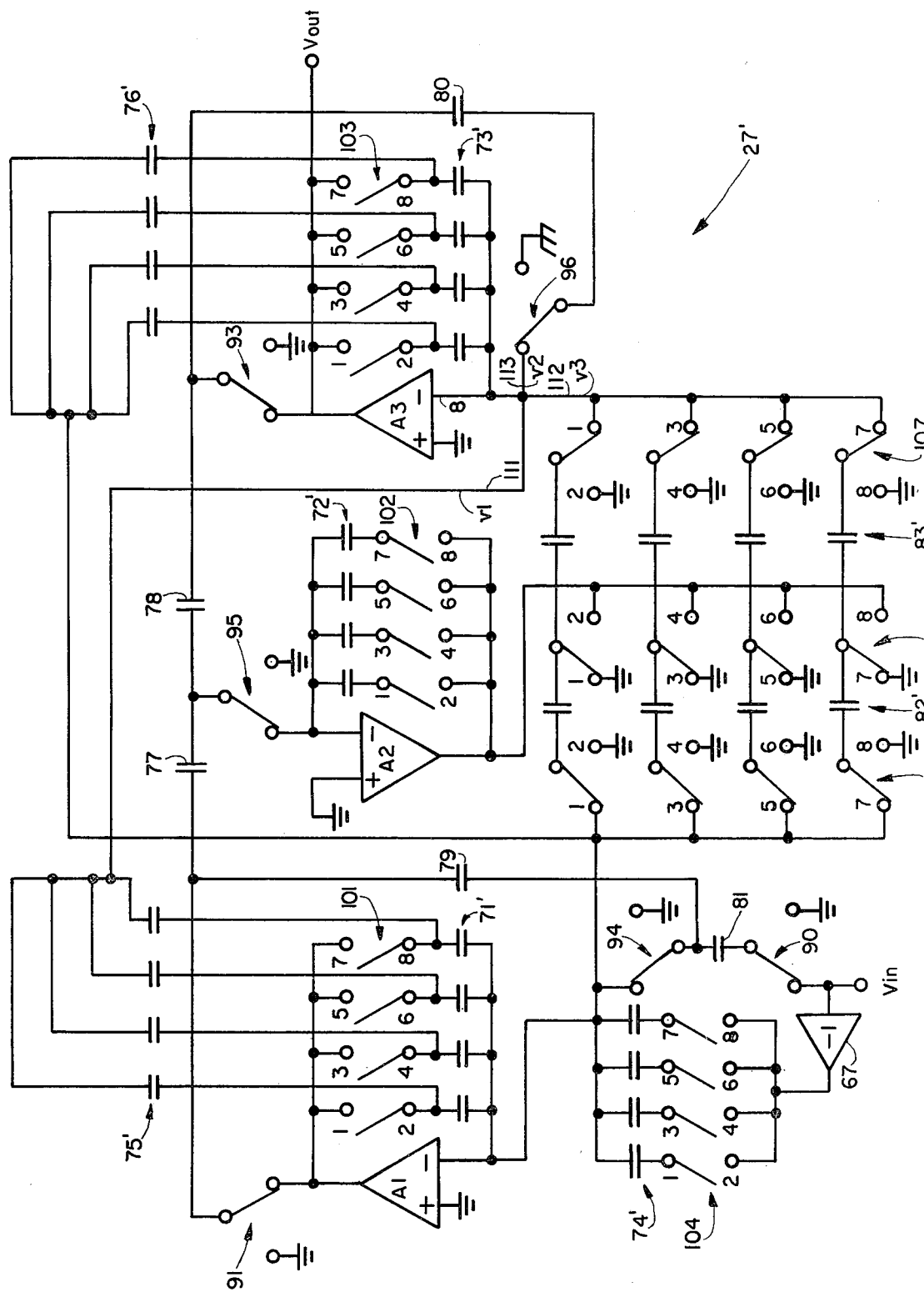
FIG. 4 is a schematic circuit diagram of the corresponding N-path switched capacitor filter for the filter network in FIG. 3, where N=4.

In accordance with this invention, the filter 27 is transformed to the corresponding switched capacitor N-path filter 27′ (where N=4) in FIG. 4. The pluralities of capacitors replacing capacitors 71–76 and 82–83 are designated by primed reference characters in FIG. 4. The switches associated with the pluralities of capacitors 71′ and 75′ and capacitors 73′ and 76′ are combined into the pluralities of commutating switches 101 and 103, respectively. The pluralities of capacitors 82′ and 83′ also share ones of the pluralities of switches 106 in FIG. 4. Referring now to the inverting input of A3, the voltages on lines 111, 112, and 113 correspond to the source voltages V1(z), V2(z) and V3(z) in FIG. 1. The various ones of the 2N=8 timing signals required for driving the various switches in FIG. 4 are designated by the numerals adjacent thereto. By way of example, various ones of the plurality of switches 104 associated with capacitors 74′ are driven by timing signals φ1+φ2; φ3+φ4; etc. The attenuation characteristics, i.e., pass-band ripple and stop-band loss, for an N-path filter 27′ that was built and operated satisfactorily were substantially identical to those predicted by theory of N-path filters.

Although this invention is described in relation to preferred embodiments thereof, variations and modifications will occur to those skilled in the art. By way of example, the switches may be implemented with CMOS transfer gates. Also, the timing signal source may periodically generate the timing signals that drive the switches. Additionally, the filters may be realized with integrated circuit technologies other than MOS, in other than fully integrated circuit form, and fully or partially implemented with discrete components. Also, the switch means may comprise other types of switching elements such as discrete transistors, electromechanical switches or relays, and other types of integrated switches. The scope of this invention is therefore to be determined from the attached claims rather than from the aforementioned detailed descriptions of preferred embodiments thereof.

What is claimed is:

1. In an N-path filter, a commutating switched capacitor integrator circuit comprising:
   an active element having a first input terminal and an output terminal;
   a first plurality of N capacitors each having the same value of capacitance;
   first switch means selectively-sequentially connecting, at a commutating rate, individual ones of said first plurality of capacitors as integrating capacitors between said active elements' first input and output terminals only during associated pairs of adjacent time slots for storing charge; and
   connecting means for selectively-sequentially connection at least one of: (1) individual ones of a second plurality of N-capacitors each having the same values of capacitance, at the commutating rate, between said first input terminal and a second input terminal only during associated pairs of adjacent time slots for selectively storing charge for an input voltage on said second input terminal; and (2) individual ones of a third plurality of capacitors of the same value of capacitance during associated pairs of adjacent time slots in a manner so as to alternately connect, at the commutating rate and during first and second time slots of each pair thereof, one and other sides of an individual one of said third plurality of capacitors to said first input terminal and a ground reference potential, respectively, and to ground and a third input terminal, respectively for alternately transferring charge between associated ones of said first and third pluralities of capacitors and storing charge on the associated one of said third plurality of capacitors for an input voltage on said third input terminal, respectively.

2. The circuit according to claim 1 wherein said connecting means is operative for selectively connecting, at the commutating rate, associated capacitors of both said second and third pluralities of capacitors as recited at (1) and (2) of claim 1.

3. The circuit according to claim 2 wherein said first input terminal of said active element has a virtual ground potential impressed on it.

4. The circuit according to claim 3 wherein said active element comprises a differential input operational amplifier having its non-inverting input terminal electrically connected to ground for impressing a virtual ground potential on its inverting input terminal which is said first input terminal.

5. The circuit according to claim 4 further comprising a first capacitor and second switch means for alternately connecting, at the commutating rate and during first and second time slots of each pair thereof, one and other sides of said first capacitor to said first input terminal and a fourth input terminal that is adapted for receiving an input voltage, respectively, and both sides of said first capacitor to ground.

* * * * *